(12) United States Patent
Takeuchi

(10) Patent No.: US 6,766,483 B2
(45) Date of Patent: Jul. 20, 2004

(54) SEMICONDUCTOR TEST APPARATUS

(75) Inventor: Nobuaki Takeuchi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 452 days.

(21) Appl. No.: 09/915,756

(22) Filed: Jul. 26, 2001

(65) Prior Publication Data

US 2002/0044474 A1 Apr. 18, 2002

(30) Foreign Application Priority Data

Jul. 31, 2000 (JP) ..................................... P2000-232334

(51) Int. Cl.[7] .......................... G11C 29/00; G01R 31/28
(52) U.S. Cl. ..................... 714/718; 714/719; 714/736; 714/738; 714/742; 324/73.1; 365/201
(58) Field of Search ............................. 714/718, 719, 714/720, 722, 733, 734, 735, 736, 738, 742, 744, 724; 324/73.1; 365/201, 194, 233, 189.01

(56) References Cited

U.S. PATENT DOCUMENTS

| | | | | |
|---|---|---|---|---|
| 4,888,715 A | * | 12/1989 | Tada et al. ................. | 714/736 |
| 5,381,421 A | * | 1/1995 | Dickol et al. ............... | 714/744 |
| 5,654,971 A | * | 8/1997 | Heitele et al. .............. | 714/735 |
| 6,006,350 A | * | 12/1999 | Tsujii .......................... | 714/738 |
| 6,094,733 A | * | 7/2000 | Momohara .................. | 714/718 |
| 6,532,561 B1 | * | 3/2003 | Turnquist et al. ........... | 714/738 |

* cited by examiner

*Primary Examiner*—Emmanuel L. Moise
(74) *Attorney, Agent, or Firm*—Darby & Darby

(57) ABSTRACT

The invention provides a structure that does not employ complicated and large-scale control circuits or control memory, minimizes the circuits for real time processing, and allows the use of refresh memory. The invention provides a test clock (8-1) comprising a data processing apparatus (1-1) provided for each electrode pin of the measured device (11), a memory (2-1) that carries out reading and writing of the test pattern data and the like, a first-in-first-out element (4-1) that executes queue processing of the data read out from the memory, a delay circuit (5-1) that delays the output signal of the first-in-first-out element, and a measured device driver (6-1) that inputs into the electrode pin the output signal of the delay circuit, and in which the data processing apparatus (1-1) of adjacent test blocks are connected into a loop via the input-output circuit (3-1).

10 Claims, 10 Drawing Sheets

SEMICONDUCTOR TEST APPARATUS

BACKGROUND OF THE INVENTION

1. Field of the Invention

The present invention relates to a semiconductor test apparatus for implementing testing of a semiconductor through a plurality of electrode pins.

2. Description of the Related Art

FIG. 12 is a block diagram showing a conventional semiconductor test apparatus. In the figure, reference numeral 10 is the measured device (hereinbelow, referred to as a DUT), and the semiconductor test apparatus measures a waveform obtained by applying a test waveform to each of the electrode pins 12-1, 12-1, . . . 12-n, of this DUT 10, or measures a waveform generated by the DUT 10. Then, by comparing this measured result to an expected value, measurement of the DUT or a determination of product acceptance or rejection is carried out. The test blocks 60-1, 60-2, . . . , 60-n apply a test signal to each pin of the DUT 10 or input a test signal generated by the DUT 10. The control circuit 54 controls the data and the operational timing of this plurality of test blocks 60-1 to 60-n based on the control of the host CPU.

Next, the operation of this conventional semiconductor test apparatus will be explained for the case in which the test waveform sent to the electrode pins 12-1 to 12-n is a digital signal. First, a timing generating circuit 53 generates the timing of the data applied to the DUT 10 or received from the DUT 10. The reading or writing of the content of the data memory 55 is carried out in synchronism with the clock of the PLL circuit 59 depending on the content of the control memory 56. Here, the digital pattern applied to the DUT 10 and the amount of delay for indicating the phase of this digital signal are written into the data memory 55. The content of the control for multiple execution of an indicated arbitrary portion of the content of the data memory 55 is written into the control memory 56.

The data read out from the data memory 55 is input into the delay circuit 57 via the control circuit 54. The delay circuit 57 generates a digital signal having an indicated delay value in synchronism with the output clock of the PPL circuit 59 based on the pattern data and the delay amount setting data output from the control circuit 54, and this is input into the pin 12-1 of the DUT 10 via the DUT driver 58.

The test blocks 60-2 to 60-n are identical circuits, and the signals respectively generated thereby are input into the electrode pins 12-2 to 12-n of the DUT 10. Moreover, although not illustrated in the figure, the signals generated by the DUT 10 are respectively written into the data memory 55-1 to 55-n in a sequence opposite to that of the signal flow described above. Then the differences between these signals and the expected values are written into the respective data memory 55-1 to 55-n. In addition, although not illustrated in the figure, an identical operation is carried out for analog signals or a power source.

However, in such a conventional semiconductor test apparatus, because the exchange of the signals between each of the test blocks 60-1 to 60-n must be carried out via the control circuit 54 and real time processing in synchronism with a clock is necessary, there are the problems that the structure of this control circuit 54 becomes complicated and large in scale, and in addition, providing both data memory 55 and control memory 56, which is the timing memory, is necessary.

In addition, the data memory 55 and the control memory 56 must carry out reading and writing in real time, and thus the use, for example, of memory that requires a refresh operation such as dynamic RAM is difficult, and furthermore, treating data that exceeds the capacity of the data memory 55 and the control memory 56 for a particular pin is difficult. Thus, there is the problem that in order to resolve these difficulties in conventional technology, the capacity of the memory must be increased, or the output signals of the other test blocks must be switched and output by the control circuit 54.

Furthermore, in order to transfer data from the host CPU to the memory of each of the blocks 60-1 to 60-n, signal switching control for transferring data to the object blocks 60-1 to 60-n via the control circuit 54 is necessary. In addition, the control circuit and devices must be changed depending on the type (analog or digital) of the signals of the DUT 10. In addition, there is the inconvenience that depending on the number of signals of the DUT 10, the number of circuits must be increased arbitrarily.

SUMMARY OF THE INVENTION

In order to resolve the above described problems, it is an object of the present invention to provide a semiconductor test apparatus whose structure does not use a complicated or large scale control circuit or control memory, can reduce the circuits for real time processing, and at the same time allows use of refresh memory, can allot a large amount of data to a particular electrode pin of the measured device without adding memory, and can realize this in a comparatively simple structure.

In order to attain the above-described object, a semiconductor test apparatus according to the present invention provides a plurality of test blocks that comprise a data processing apparatus (in the present embodiments, the digital signal processor (DSP) and the microprocessor (CPU)) provided for each of the electrode pins of the measured device, memory that stores test pattern data, the delay amount setting data, and the control pattern data, and carries out reading and writing of this data under the control of the data processing apparatus, a first-in-first-out element that executes the queue processing of the serial signals that are the serially processed data read out from the memory, a delay circuit that delays the output signal of the first-in-first-out elements at a timing in synchronism with a reference clock, and a measured device driver that inputs the output signal of the delay circuit into the electrode pins of the measured device, and in which the data processing apparatus of each of the adjacent test blocks are connected together into a loop via an input-output circuit provided on each of these test blocks.

In addition, the semiconductor test apparatus according to the present invention provides a plurality of test blocks comprising a data processing apparatus provided for each of the electrode pins of the measured device, memory that stores the expected value data and the phases of the measured device, and carries out the reading and writing of the data under the control of the data processing apparatus, first-in-first-out element that executes queue processing of the serial signals that are serially processed data read out from the memory, and a measured device receiver that compares the expected value data obtained from the first-in-first-out element to output signals received from the electrode pin of the measured device, outputs a signal indicating whether or not they agree, and stores the result in the memory via the first-in-first-out element, and in which the data processing apparatus of each of these adjacent test blocks are connected together into a loop via the input/output circuit provided on each of the test blocks.

In addition, the semiconductor test apparatus according to the present invention provides a plurality of test blocks comprising a data processing apparatus provided for each of the electrode pins of the measured device, memory that stores the test pattern data, the delay amount setting data, and the control pattern data, and carries out reading and writing of the waveform data of the data under the control of the data processing apparatus, a first-in-first-out element that executes queue processing of serial signals that are serially processed data read from the memory, and a digital/analog conversion circuit that converts the output signal of the first-in-first-out element to an analog signal and inputs the result into the electrode pins of the measured device at a timing in synchronism with a reference clock, and in which the data processing apparatus of each of the adjacent test blocks are connected together into a loop via the input/output circuit provided on each of the test blocks.

In addition, the semiconductor test apparatus according to the present invention provides a plurality of test blocks comprising a data processing apparatus provided for each of the electrode pins of the measured device, an analog/digital conversion circuit that converts an analog output signal received from an electrode pin of the measured device to a digital signal at a timing in synchronism with a reference clock, first-in-first-out element that executes queue processing of the output signal of the analog/digital conversion circuit, and memory that stores the output signal of the first-in-first-out element based on the control of the data processing apparatus, and in which the data processing apparatus of each of the adjacent test blocks are connected together into a loop via the input/output circuit provided on each of the test blocks.

In addition, in the semiconductor test apparatus according to the present invention, the data processing apparatus supplies in parallel to each of the electrode pins of the measured device via each of the individual measured device drivers a plurality of types of data that is stored in the memory.

In addition, in the semiconductor test apparatus according to the present invention, the plurality of test blocks are partitioned into a part having common circuits for all of the blocks and part having circuits that differ depending on the measurement conditions.

In addition, in the semiconductor test apparatus according to the present invention, the plurality of test blocks are connected to each other via connectors having terminals identical to the printed circuit board on which the data processing apparatuses are mounted.

In addition, in the semiconductor test apparatus according to the present invention, the data processing apparatus is a digital signal processor (DSP) or a microprocessor (CPU).

In addition, in the semiconductor test apparatus according to the present invention, the read-out speed of the memory controlled by the data processing apparatus is set so as to be slightly faster than the average output interval of the first-in-first-out elements.

In addition, in the semiconductor test apparatus according to the present invention, identical trigger signals are input into all of the data processing apparatuses.

DETAILED DESCRIPTION OF THE INVENTION

Figure 1:
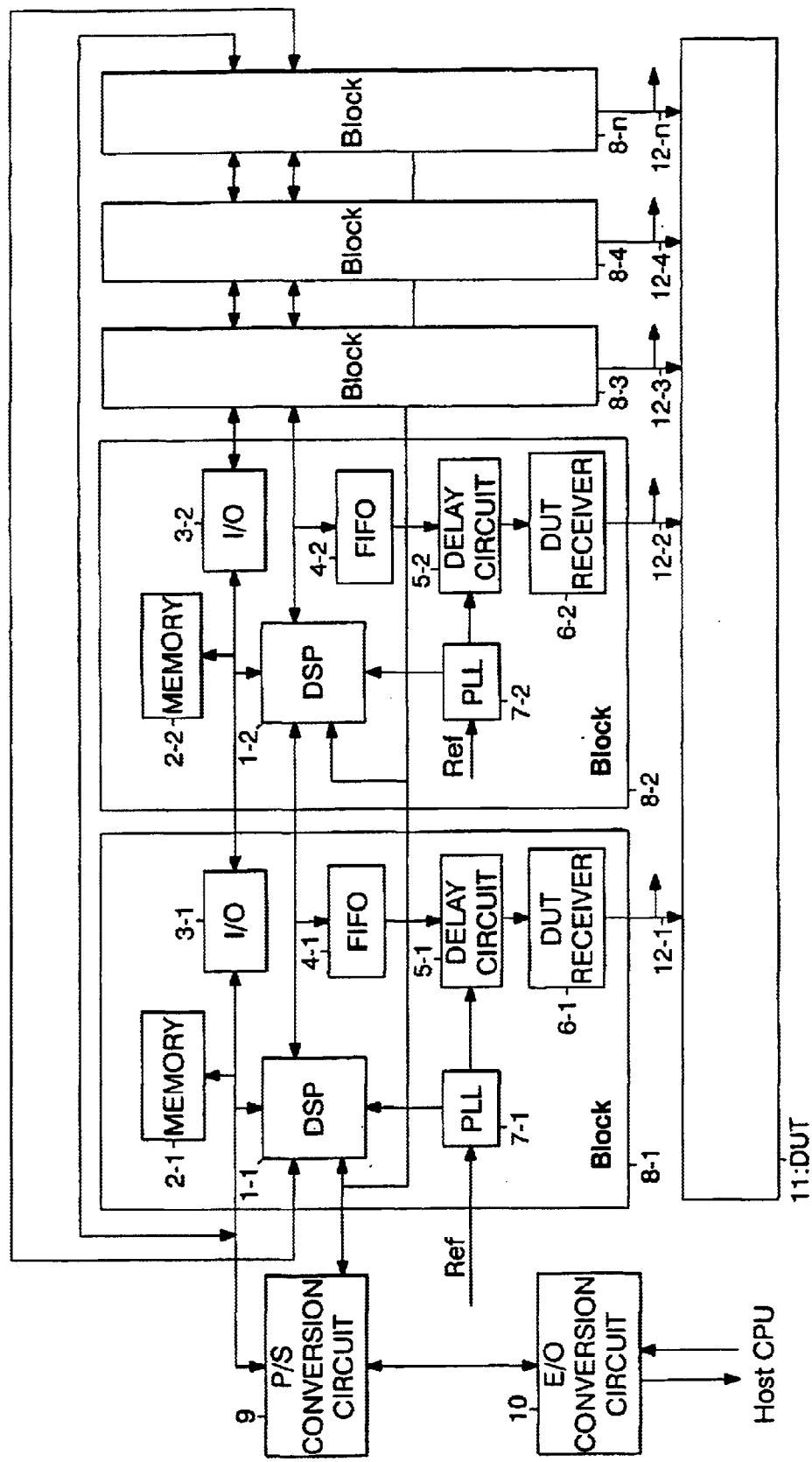
FIG. 1 is a block drawing showing the semiconductor apparatus according to an embodiment of the present invention.

Below, the embodiments of the present invention will be explained referring to the drawings. FIG. 1 is a block diagram showing a semiconductor apparatus of the present invention, and reference numeral 11 is a DUT having n electrode pins 12-1 to 12-n for digital signal input. These electrode pins 12-1 to 12-n for digital signal input can function as electrode pins for digital signal output, electrode pins for analog signal input, electrode pins for analog signal output, and electrode pins for a power source, or alternatively, one pin can carry out the functions of this plurality of electrodes. Moreover, for the sake of simplifying the explanation, in FIG. 1, the explanation will be limited to electrode pins for digital signal input. In addition, reference numerals 8-1 to 8-n are test blocks that apply a predetermined test digital signal to the DUT pins 12-1 to 12-n, measure the signals obtained from the DUT 11, or carries out quality control by comparing the results of this measurement to an expected value. Specifically, at these test blocks 8-1 to 8-n, n types of respective digital signals are generated and supplied to each of the digital signal input electrode pins 12-1 to 12-n.

In addition, in each of the test blocks 8-1 to 8-n, reference numerals 1-1 to 1-n are digital signal processors (hereinbelow referred to as DSPs) that read out delay amount setting data and control pattern data stored in the memory 2-1 to 2-n, and reference numerals 4-1 to 4-n are first-in-first-out elements (hereinbelow referred to as FIFOs) that carry out queue processing of each data that the DSPs 1-1 to 1-n has read out. Here, test pattern data is the digital signal pattern itself applied to the DUT 11, the delay amount setting data is information for setting the phase of the test pattern and indicates for each pattern (bit) the delay time of the test pattern from the reference clock. The control pattern data is control data for repeating an arbitrary number of times the arbitrary locations of each data.

In addition, reference numerals 5-1 to 5-n are delay circuits that delay the output of the FIFOs 4-1 to 4-n for a fixed time interval in synchronism with each of the clocks of the phase locked loops 7-1 to 7-n (hereinbelow referred to as PLLs), and input the output of the FIFOs 4-1 to 4-n into each of the digital signal input electrode pins 12-n to 12-n of the DUTs via the DUT drivers 6-1 to 6-n. Reference numeral 10 is an electrooptic conversion circuit (hereinbelow referred to as the E/O circuit) that converts an optical signal from the host CPU to an electric serial signal, converts the electric signal from the parallel/serial conversion circuit 9 (hereinbelow referred to as the P/S circuit) into an optical signal, and supplies the result to the host CPU. The P/S conversion circuit 9 is connected to the bus of the DSP 1-1 and the input/output circuit 3-1 (hereinbelow referred to as I/O circuits). Moreover, the I/O circuits 3-1 to 3-n of each of the respective test blocks 8-1 to 8-n are serially connected. Furthermore, the DSP 1-1 is connected to the memory 2 by a parallel bus and the bus of the DSP 1-2 in the adjacent test block 8-2 via the I/O circuit 3-1.

Next the operation will be explained. Moreover, the internal structure of each of the test blocks 8-1 to 8-n are identical, and thus their explanations are represented by the explanation of test block 8-1. First, the parallel signal of the test pattern data and the like read out from the memory 2-1 is converted to a serial signal in the DSP 1-1 and input into the FIFO 4-1. Then the signal output from this FIFO 4-1 is input into the delay circuit 5-1. Here, the DSP 1-1 operates based on the clock generated by the PLL 7-1, but the operation of the program, the refresh operation of the DRAM, and the like do not always read the contents of the memory 2-1 at identical time intervals. However, a signal must be supplied at a predetermined time to the DUT 11.

The FIFO 4-1 resolves this problem, and while the interval between the output signals of the DSP 1-1, which are the input signals, are to a certain extent irregular, the FIFO 4-1 has internal multistage buffers, and thus can resolve this irregularity. Moreover, the average time interval of the signal input into the FIFO 4-1 and the average time interval of the signal output must be equal. Thus, the memory read-out operation interval of the DSP 1-1 must be slightly shorter than the average output interval.

The output signal of the delay circuit 5-1 is input into the electrode pin 12-1 of the DUT 11 via the DUT driver 6-1. The DUT driver 6-1 must function to set the oscillation of the test pattern signal, etc., but as this is not directly related to the present invention, the description of this function has been omitted. Moreover, if the DSP 1-1 has a function similar to a CPU, this DSP 1-1 can be replaced by a CPU. Additionally, in addition to the FIFO 4-1, the serial signal output of the DSP 1-1 is connected to the serial signal input electrode pin of the DSP 1-2 of the test block 8-2. Moreover, the serial signal from the test block 8-n of the last stage is connected to a different serial input electrode pin in DSP 1-1. This means that these DSPs 1-1 to 1-n are connected in a loop. Moreover, the serial signals of these DSPs 1-1 to 1-n are capable of bi-directional operation. Completely identical operations are carried out for the test blocks 8-2 and after. Moreover, an identical reference signal (Ref) is input in parallel to all PPLs 7-1 to 7-n, and thus the output of all the n PPLs 7-1 to 7-n are in phase. In addition, at all of the DSPs 1-1 to 1-n, identical trigger signals are input in parallel, and in synchronism with these trigger signals, the DSPs 1-1 to 1-n initiate operation. Furthermore, the optical signal from the host CPU is converted to an electric serial signal by the E/O conversion circuit 10, and the optical signal to the host CPU is an electric signal that has been converted to an optical signal by the E/O conversion circuit 10, and output. In addition, the P/S conversion circuit 9 converts the serial signals and parallel signals that are input therein respectively to parallel signals and serial signals.

Figure 2:
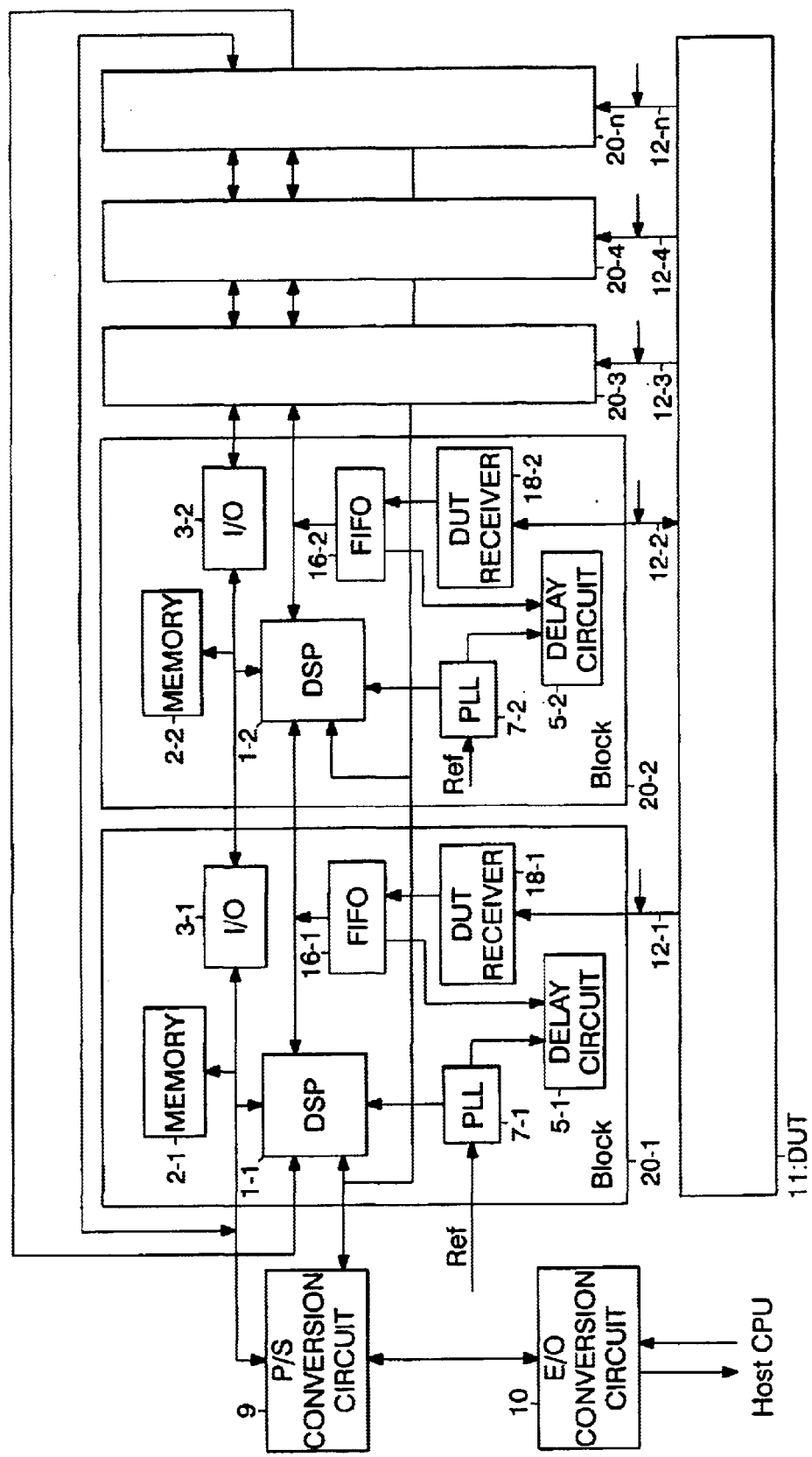
FIG. 2 is a block drawing showing the semiconductor apparatus according to another embodiment of the present invention.

FIG. 2 shows an example of measuring a signal generated by the DUT 11. While the structure is substantially identical to that of the case shown in FIG. 1, the flow of the signals is reversed. That is, the DUT 11, DSP 1-1 to 1-n, the memory 2-1 to 2-n, the I/O circuits 3-1 to 3-n, the PPL circuits 7-1 to 7-n, the delay circuits 5-1 to 5-n, the P/S conversion circuit 9, and the O/E conversion circuit 10 are completely identical to those shown in FIG. 1. In this example, the DUT output signal output from the electrode pin 12-1 of the DUT 11 is input into the DUT receiver 18. The DSP 1-1 reads out the expected value data for the DUT 11 stored in the memory 2-1 and the delay time data from its phase, that is, the reference clock, converts this to a serial signal, and inputs the result into the FIFO 16. Furthermore, the expected value data and the phase of the signal output from the FIFO 16 are produced by the delay circuit 5-1, and sent to the DUT receiver 18. The DUT receiver 18 compares the output signal from the DUT 11 and the expected value from the delay circuit 5-1, and inputs into the FIFO 16 the signal that agrees with the expected value or with both signals. The input signal is input into the DSP 1-1, and stored in the memory 2-1. Moreover, the same operation is carried out for each of the test blocks 20-1 to 20-n. The sending and receiving of data with the host CPU is completely identical to the case explained for FIG. 1. In this manner, the output signal of the DUT 11 is stored in the memory 2-1 and sent to the host CPU.

Figure 3:
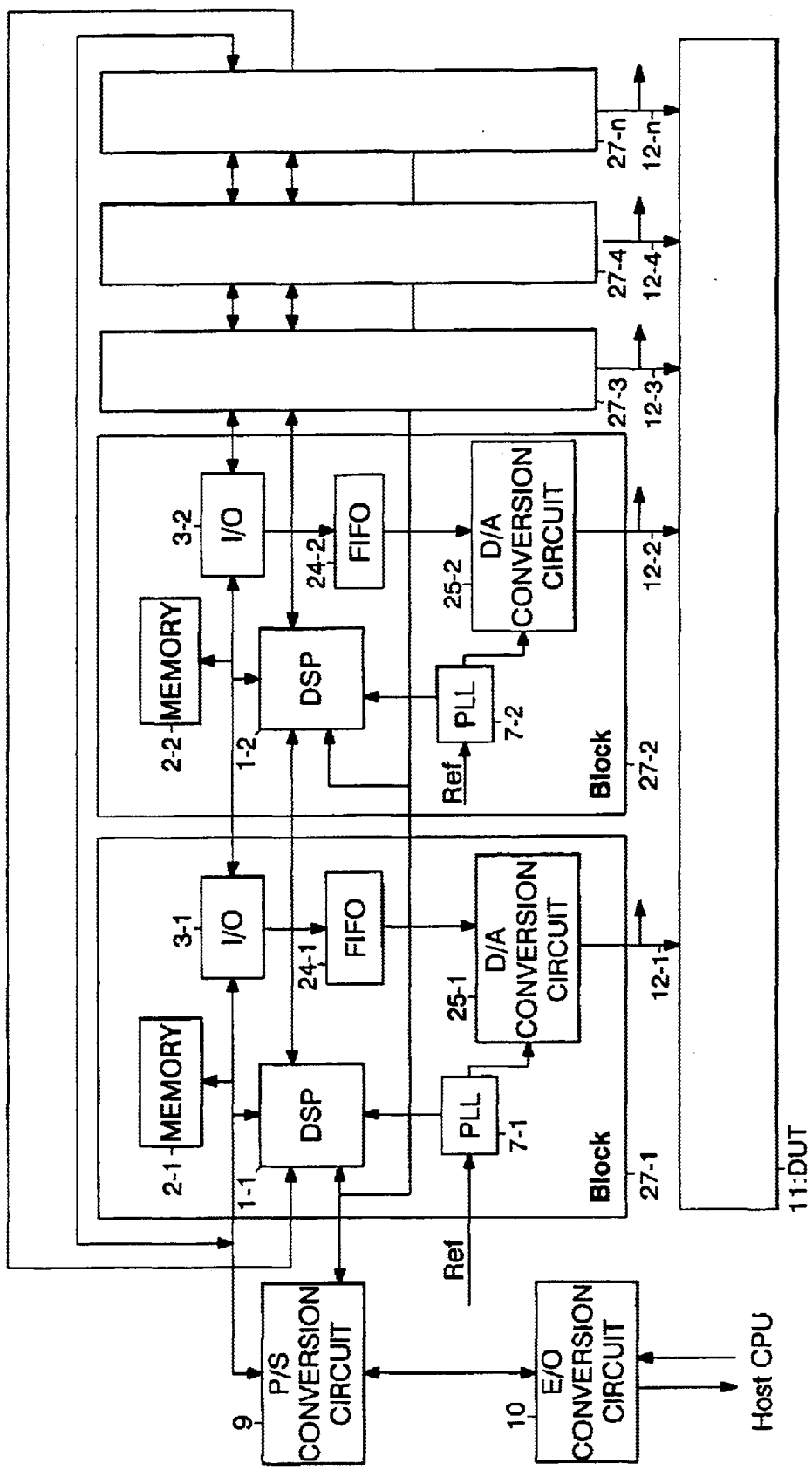
FIG. 3 is a block drawing showing the semiconductor apparatus according to another embodiment of the present invention.

FIG. 3 shows an example in which an analog signal is output to the DUT 11. The points that differ from FIG. 1 are that the signals of the test pattern data and the like read out from the memory 2-1 are output as parallel signals to the FIFOs 24-1 to 24-n and that instead of the DUT drivers 6-1 to 6-n, D/A converters 25-1 to 25-n are used. In addition, except for the delay circuits 5-1 to 5-n, the remainder is the same. Thereby, the data such as the test pattern data stored in the memory 2-1 to be applied to the DUT 11 is read out by the DSP 1-1, and input into the FIFO 24-1 via the I/O circuit 3-1. In addition, the output of the FIFO 24-1 is converted to an analog signal by the D/A conversion circuit 25-1. In order for the D/A conversion circuit 25-1 to operate with the clock of the PLL 7-1, the output of the D/A conversion circuit 25-1 becomes a waveform in synchronism with the reference signal Ref, and is input into the electrode pin 12-1 of the DUT 11.

In the actual semiconductor test apparatus, an amplifier and band limiting filters and the like are necessary at the output side of the A/D conversion circuit 25-1, but because this is not connected with the present invention, the explanation thereof has been omitted. In addition, test blocks 27-2 to 27-n identical to the test block 27-n having the structure described above are arranged in parallel, and connected to each other in a loop. Data transfer between the host CPU and these test blocks 27-1 to 27-n is completely identical to the cases explained in FIG. 1 and FIG. 2.

Figure 4:
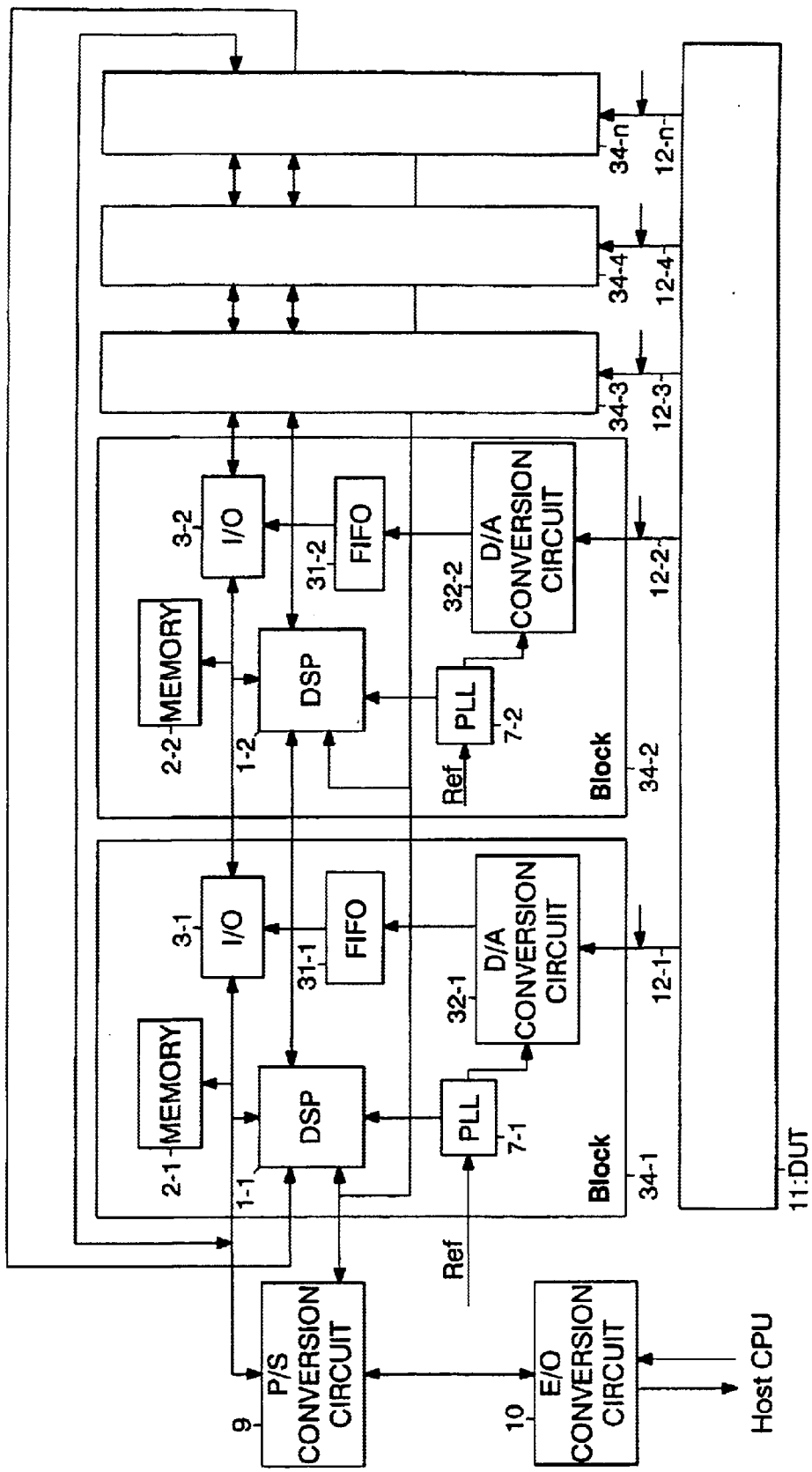
FIG. 4 is a block drawing showing the semiconductor apparatus according to another embodiment of the present invention.

FIG. 4 shows an example of the reception of an analog signal output from the DUT 11. The flow of the signals is the reverse of that in FIG. 3, and otherwise, the remainder is completely identical to FIG. 3. Thereby, the analog signal generated at the electrode pin 12-1 of the DUT 11 is converted to a digital signal by the A/D conversion circuit 32-1. Because it is operated by the output clock of the PPL 7-1, the A/D conversion circuit 32-1 is sampled in synchronism with the reference signal. The output of the A/D conversion circuit 32-1 is input into the FIFO 31-1. The output of the FIFO 31-1 is stored in the memory 2-1 by the DSP 1-1 via the I/O circuit 3-1.

At the actual semiconductor test apparatus, amplifiers and band limiting filters are necessary on the output side of the D/A conversion circuit 32-1, but because this does not directly relate to the present invention, the explanation thereof is omitted. In addition, and test blocks 34-2 to 34-n having a structure identical to that of test block 34-1 described above are provided in parallel, and these are connected to each other to form a loop. The data transfer between the host CPU and these test blocks 34-1 to 34-n and the data transfer between blocks are exactly the same as the data transfer between blocks in FIGS. 1 and 2.

In addition, using power source circuits instead of the A/D conversion circuits 32-1 to 32-n and the D/A conversion circuits 25-1 to 25-n in FIG. 3 and FIG. 4 to form a plurality of power sources can be done in exactly the same manner, although not illustrated. In FIG. 1 to FIG. 4, the signals input into and output from the DUT 11 were explained according to type, but different types of test blocks can be connected into a loop, and an arbitrary structure can be built depending on the number and type of signals to and from the DUT 11. In addition, in the case that bidirectional signals, that is, input and output signals, are supplied to the electrode pins 12-1 to 12-n of the DUT 11, the test block for the input signals and the test block for the output signals can be connected in parallel. In this case as well, the transfer of data between the host CPU and these blocks and the data transfer between blocks is completely identical to the case in which they are formed by one type of block.

Figure 5:
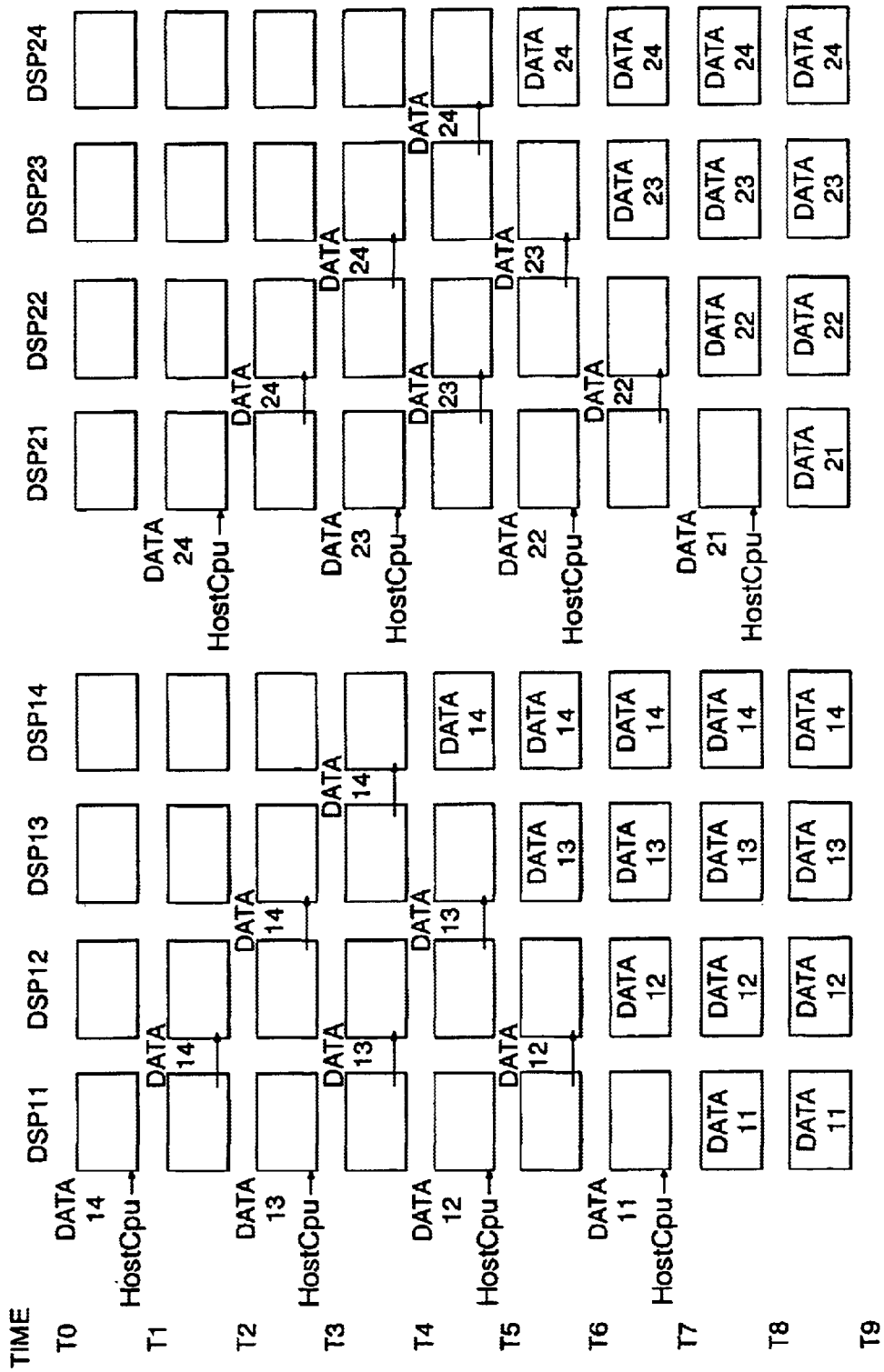
FIG. 5 is an explanatory drawing showing the transfer sequence of data in the present invention.

Next, the data transfer between the host CPU and the DSPs 1-1 to 1-n will be explained. FIG. 5 shows an example of transfer from the host CPU to the DSP. The blocks connected in a loop are separated into two groups or one ring-shaped block is separated into two groups. The DSPs of these blocks form a group comprising DSP 11, DSP 12, . . . , DSP 14 and a group comprising DSP 21, DSP 22, . . . , DSP 24. The movement of data will be explained along with the time transitions T0 to T9:

(a) Between times T0 and T1, the host CPU transfers data DATA 14 for DSP 14 to DSP 11.
(b) Between times T1 and T2, the host CPU transfers data DATA 24 for DSP 24 to DSP 21. At the same time, DSP 11 transfers data DATA 14 to DSP 12.
(c) Between times T2 and T3, the host CPU transfers data DATA 13 for the DSP 13 to the DSP 11. At the same time, DSP 12 transfers data DATA 14 to DSP 13, and DSP 21 transfers data DATA 24 to DSP 22.
(d) Between time T3 and T4, the host CPU transfers data DATA 23 for DSP 23 to DSP 21. At the same time, DSP 11 transfers data DATA 13 to DSP 12, DSP 13 transfers data DATA 14 to DSP 14, and DSP 22 transfers data DATA 24 to the DSP 23.

In this manner, data is transferred in sequence, and thereby all data can be transferred by time T9. In this example, there were eight DSPs, the operation is completely identical for not just eight, but an arbitrary number of DSPs as well. The data transfer is carried out in compete amounts, not by 1 bit or 1 byte, because the block transfer function of the DSP and CPU can be effectively utilized, and the transfer speed is much higher than transfer by 1 bite or by 1 byte.

Figure 6:
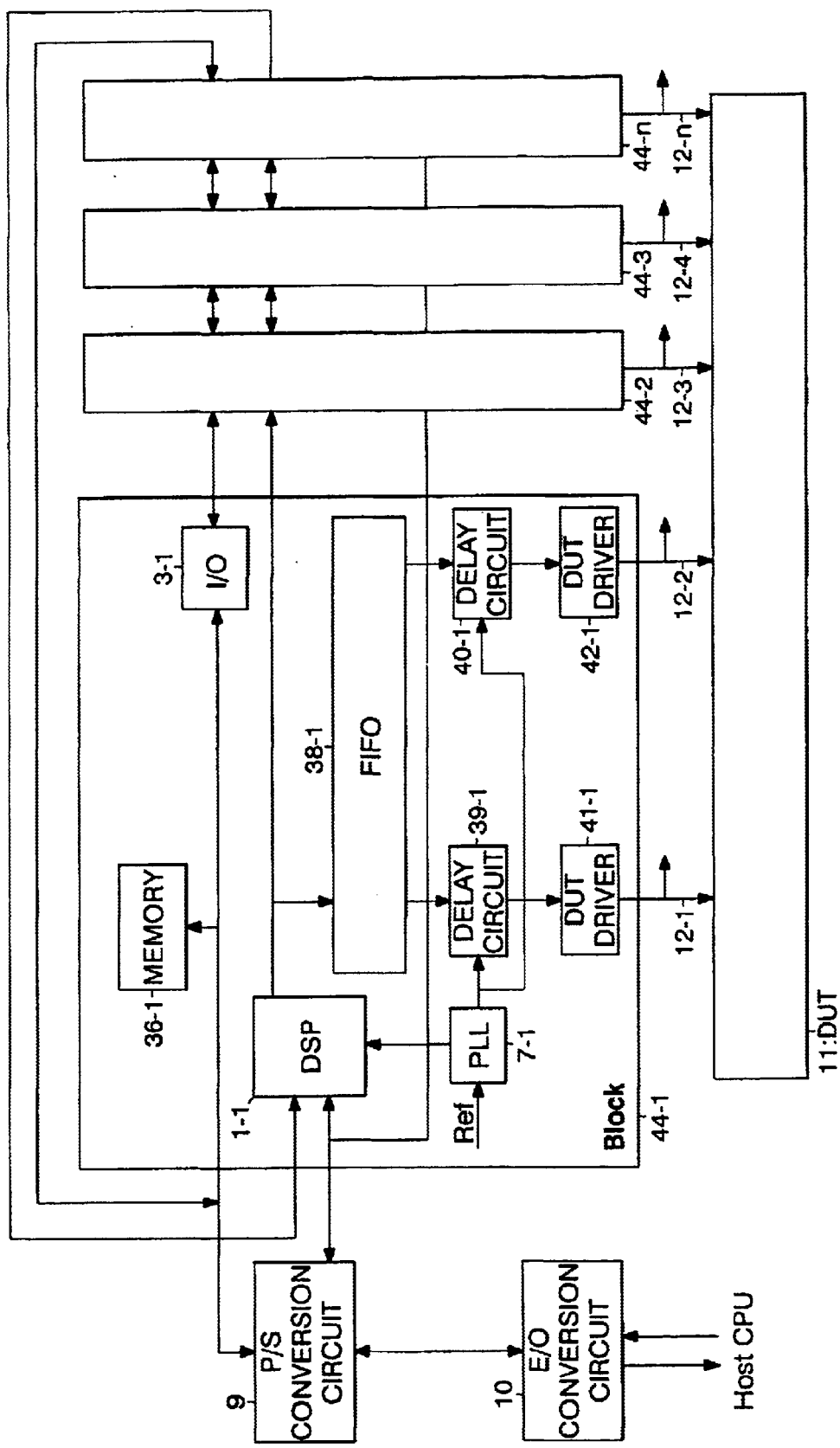
FIG. 6 is a block drawing showing the semiconductor apparatus according to another embodiment of the present invention.

FIG. 6 shows an example in which a plurality of signals is controlled by one DSP. Two types of waveform data, or specifically, the pin portions of the DUT 11, are stored in the memory 36-1. The DSP 1-1 reads out the data for two pins from the memory 36-1, and inputs this into the FIFO 38-1. The FIFO 38-1 partitions this into two parts and outputs them to the delay circuit 39-1 and the delay circuit 40-1. Both of the delay circuits 39-1 and 40-1 produce waveforms applied to the DUT in synchronism with the output of the PLL 7-1, and output one part to the DUT driver 41-1 and one part to the DUT driver 42-1. The output of the DUT driver 41-1 and the DUT driver 42-1 are respectively input into the electrode pins 12-1 and 12-2 of the DUT 11.

In this circuit, the circuits subsequent to the FIFO 38-1 operate two pins in parallel, and is completely identical to FIG. 1. The condition of operability is that the processing speed of DSP 1-1 be high with respect to the speed of the data applied to the DUT 11. In this manner the signals for a plurality of pins can be controlled by the one DSP 1-1, and in addition, as types of signals, digital signal output, digital signal input, analog signal output, analog signal input, power source, and the like can all be treated identically.

Figure 7:
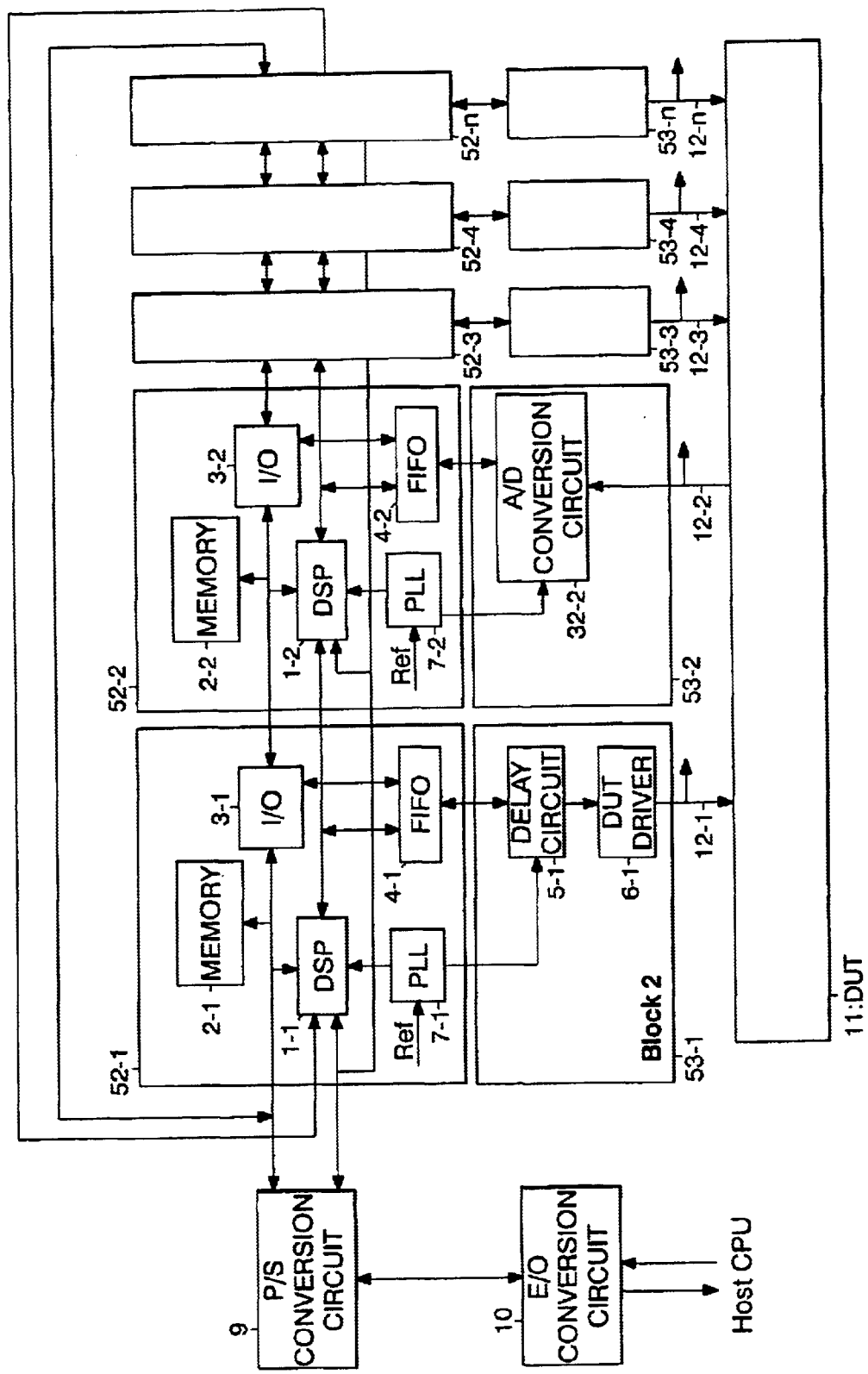
FIG. 7 is a block drawing showing the semiconductor apparatus according to another embodiment of the present invention.

FIG. 7 is an example in which the test blocks that have been explained are partitioned into two parts, and the peripheral components for DSP 1-1 are shared. Thereby, the test block 52-1 is structured by the DSP 1-1, memory 2-1, I/O 3-1, FIFO 4-1, and PLL 7-1. This part is completely identical to the structures shown in FIG. 1 to FIG. 4 that have already been explained.

The delay circuit 5-1 and DUT driver 6-1 serve as the test block 53-1. This test block 53-1 corresponds to the case of digital signal generation, that is, to the case shown in FIG. 1. In contrast, the test block 52-2 is completely identical to the test block 52-1. Test block 53-2 is formed by the A/D conversion circuit 32-2, and this functions as a test block for analog signal reception.

Thereby, shared test blocks can be used for a plurality of types of signals, and furthermore, many signals having a plurality of types can be treated simultaneously. Moreover, the operation and signal transfer are completely identical to the cases shown in FIG. 1 to FIG. 4.

Figure 8:
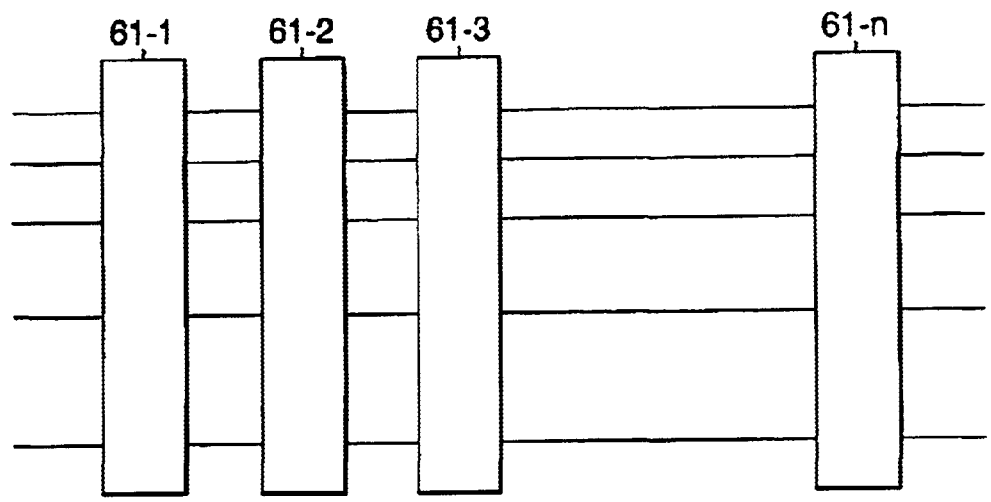
FIG. 8 is an explanatory drawing showing the amplification method of the test block in the present invention.
Figure 9:
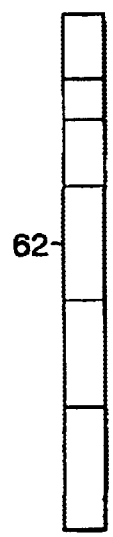
FIG. 9 is a side view showing the printed circuit board not having digital signal processors mounted.
Figure 10:
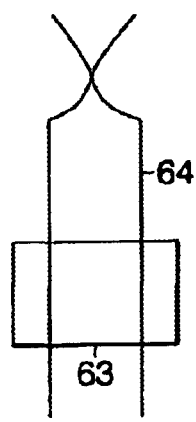
FIG. 10 is a side view showing the connector structure when the printed circuit board is not mounted.
Figure 11:
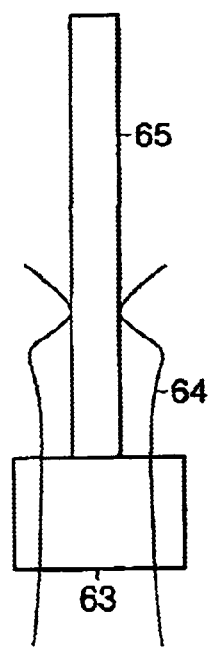
FIG. 11 is a side view showing the connector structure when the printed circuit board has been mounted.
Figure 12:
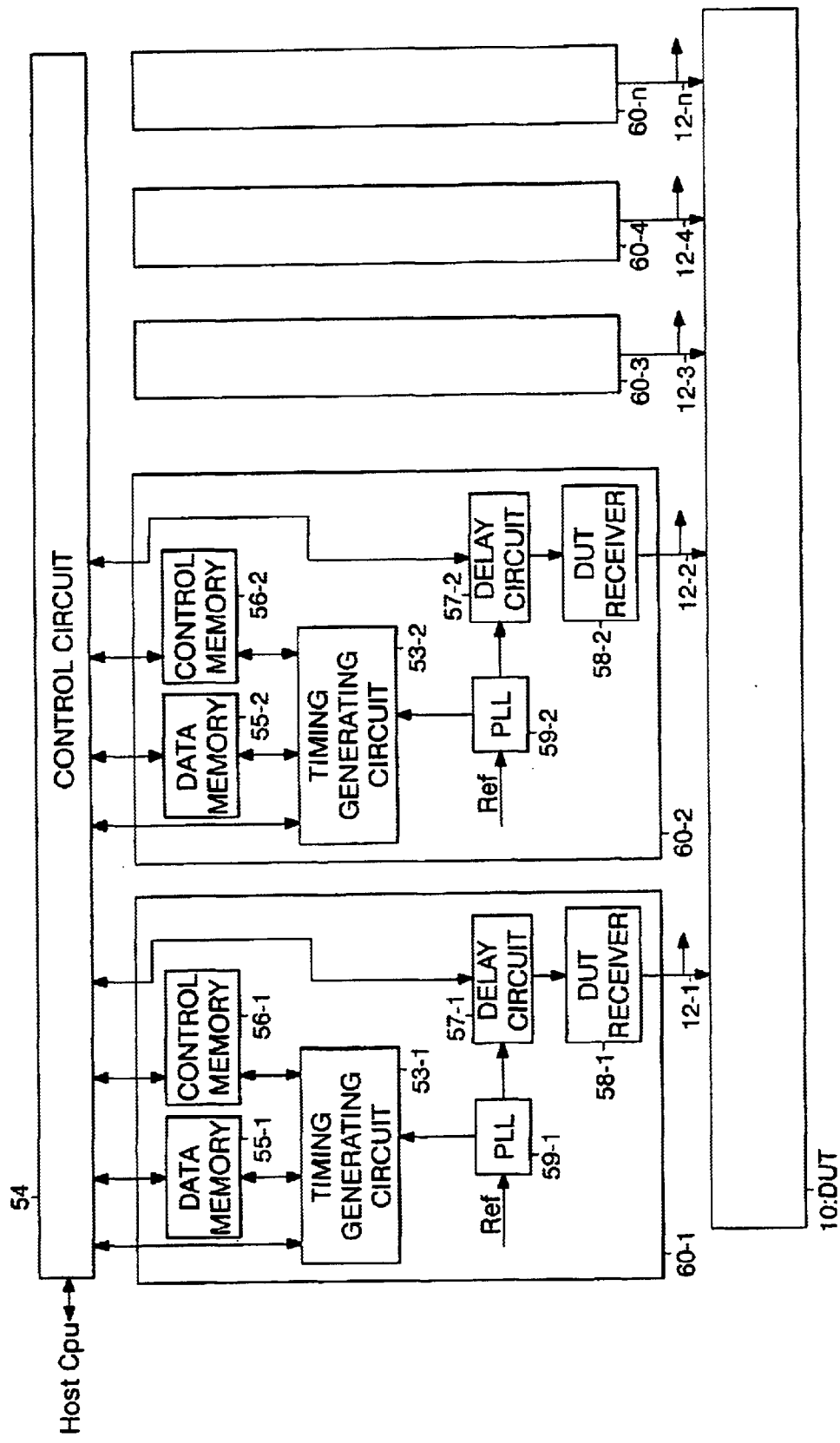
FIG. 12 is a block diagram showing a conventional semiconductor test apparatus.

Next, the method of increasing and decreasing the test blocks will be explained referring to FIG. 8. The number of blocks can be arbitrarily set depending on the types of signals input into and output from the DUT 11 and the number of pins. Here, a simple example will be illustrated. First, connectors 61-1 to 61-n, which can set the maximum number of blocks, are prepared, and connectors 61-1 to 61-n are each connected serially in a loop. The connected signals are the I/O signals between each DSP 1-1 shown respectively in FIG. 1 to FIG. 4. These signals connect adjacent DSPs 1-1 to 1-n shown for example in FIG. 1. The printed circuit board on which the DSPs 1-1 to 1-n are mounted has tooth shaped terminals, and are engaged with the connectors 61-1 to 61-n. Printed circuit boards 62 such as that shown in FIG. 9 are mounted on the connectors 61-1 to 61-n, which are not mounted on the blocks 8-1 to 8-n that are mounted on DSPs 1-1 to 1-n. This printed circuit board 62 has tooth-shaped terminals like the printed circuit board on which the DSPs 1-1 to 1-n are mounted, and tooth-shaped terminals at identical positions on the underside of the printed circuit board are wired. By mounting this printed circuit board 62 on each of the connectors 61-1 to 61-n, signals can be transferred to respective adjacent connectors. This means that DSPs 1-1 to 1-n can be arbitrarily increased or decreased. In addition, as shown in FIG. 10, in the case that the printed circuit board is mounted on connector 63, a structure in which an electrode pin pair 64a and 64b are connected can be provided. Thereby, when the printed circuit board 65 is mounted, as shown in FIG. 11, electrode pins 64a and 64b contact the tooth-shaped part of the printed circuit board.

As explained above, according to the present invention, the advantages are attained that a semiconductor test apparatus can be constructed without special control circuits, circuits that carry out real time processing in synchronism with a clock become few, and in addition, the data transfer between each of the test blocks is simplified. In addition, there is no distinction between data memory and timing control memory, and thus one type of memory is sufficient. Furthermore, the real time character of the writing and reading of memory disappears. In addition, memory requiring a refresh operation can be used, and thus large quantities of data can be allotted to special pins without increasing the memory. Furthermore, there are the effects that the data transfer from the CPU is simple, and the same circuits can be used irrespective of the type of data of the measured device.

What is claimed is:

1. A semiconductor test apparatus providing a plurality of test blocks comprising:
   a data processing apparatus provided for each of the electrode pins of a measured device;
   memory that stores test pattern data, the delay amount setting data, and the control pattern data, and carries out reading and writing of this data under the control of said data processing apparatus;
   a first-in-first-out element that executes the queue processing of the serial signals that are the serially processed data read out from said memory;
   a delay circuit that delays the output signal of said first-in-first-out elements at a timing in synchronism with a reference clock; and
   a measured device driver that inputs the output signal of said delay circuit into the electrode pins of said measured device, and
   in which the data processing apparatus of each of the adjacent test blocks are connected together into a loop via an input-output circuit provided on each of these test blocks.

2. A semiconductor test apparatus providing a plurality of test blocks comprising:
   a data processing apparatus provided for each of the electrode pins of a measured device;
   a memory that stores the expected value data and the phases of said measured device, and carries out the reading and writing of the data under the control of said data processing apparatus;
   a first-in-first-out element that executes queue processing of the serial signals that are the serially processed data read out from said memory; and
   a measured device receiver that compares the expected value data obtained from said first-in-first-out element to output signals received from the electrode pin of said measured device, outputs a signal indicating whether or not they agree, and stores the result in the memory via said first-in-first-out element, and
   in which the data processing apparatus of each of the adjacent test blocks are connected together into a loop via the input/output circuit provided on each of the test blocks.

3. A semiconductor test apparatus that provides a plurality of test blocks comprising:
   a data processing apparatus provided for each of the electrode pins of a measured device;
   a memory that stores the test pattern data, the delay amount setting data, and the control pattern data, and carries out reading and writing of the waveform data of the data under the control of said data processing apparatus;
   a first-in-first-out element that executes queue processing of serial signals that are serially processed data read from said memory; and
   a digital/analog conversion circuit that converts the output signal of said first-in-first-out element to an analog signal and inputs the result into the electrode pins of said measured device at a timing in synchronism with a reference clock, and
   in which the data processing apparatus of each of the adjacent test blocks are connected together into a loop via the input/output circuit provided on each of the test blocks.

4. A semiconductor test apparatus providing a plurality of test blocks comprising:
   a data processing apparatus provided for each of the electrode pins of a measured device;
   an analog/digital conversion circuit that converts an analog output signal received from an electrode pin of said measured device to a digital signal at a timing in synchronism with a reference clock;
   a first-in-first-out element that executes queue processing of the output signal of said analog/digital conversion circuit; and
   a memory that stores the output signal of said first-in-first-out element based on the control of the data processing apparatus, and
   in which the data processing apparatus of each of the adjacent test blocks are connected together into a loop via the input/output circuit provided on each of the test blocks.

5. A semiconductor test apparatus according to claim 1 wherein said data processing apparatus supplies in parallel to each of the electrode pins of the measured device via each of the individual measured device drivers a plurality of types of data that is stored in the memory.

6. A semiconductor test apparatus according to any of claim 1 through claim 5 wherein said plurality of test blocks are partitioned into a part having shared circuits for all of the blocks and a part having circuits that differ depending on the measurement conditions.

7. A semiconductor test apparatus according to any of claim 1 through claim 5 wherein said plurality of test blocks are connected to each other via connectors having terminals identical to the printed circuit board on which the data processing apparatuses are mounted.

8. A semiconductor test apparatus according to any of claim 1 through claim 5 wherein said data processing apparatus is a digital signal processor or a microprocessor.

9. A semiconductor test apparatus according to any of claim 1 through claim 5 wherein said read-out speed of the memory controlled by said data processing apparatus is set so as to be slightly faster than the average output interval of the first-in-first-out elements.

10. A semiconductor test apparatus according to any of claim 1 through claim 5 wherein identical trigger signals are input into all of said data processing apparatuses.

* * * * *